United States Patent
Katznelson et al.

[11] Patent Number: 5,900,793
[45] Date of Patent: May 4, 1999

[54] PERMANENT MAGNET ASSEMBLIES FOR USE IN MEDICAL APPLICATIONS

[76] Inventors: Ehud Katznelson, Ramat Yshai; Yuval Zuk, Haifa; Michael Sasson, Karkur; Zeev Tamir, Haifa, all of Israel

[21] Appl. No.: 08/898,773

[22] Filed: Jul. 23, 1997

[51] Int. Cl.⁶ .................................................. H01F 3/00
[52] U.S. Cl. ........................... 335/296; 335/298; 335/299
[58] Field of Search ..................... 335/216, 296, 335/297, 298, 299, 300, 301, 302; 324/318, 319, 320, 322

[56] References Cited

U.S. PATENT DOCUMENTS

| | | | |
|---|---|---|---|
| H1615 | 12/1996 | Leupold | 335/210 |
| 4,341,220 | 7/1982 | Perry . | |
| 4,608,977 | 9/1986 | Brown . | |
| 4,829,252 | 5/1989 | Kaufman . | |
| 4,875,485 | 10/1989 | Matsutani . | |
| 5,134,374 | 7/1992 | Breneman et al. . | |
| 5,304,933 | 4/1994 | Vavrek et al. . | |
| 5,332,971 | 7/1994 | Aubert . | |
| 5,365,927 | 11/1994 | Roemer et al. . | |
| 5,390,673 | 2/1995 | Kikinis . | |
| 5,410,287 | 4/1995 | Luskaris et al. . | |
| 5,428,292 | 6/1995 | Dorri et al. | 324/319 |
| 5,570,073 | 10/1996 | Mueller | 335/299 |
| 5,677,630 | 10/1997 | Laskaris et al. . | |
| 5,696,449 | 12/1997 | Boskamp . | |

*Primary Examiner*—Lincoln Donovan

[57] ABSTRACT

Permanent magnet assemblies are disclosed for use in medical applications, particularly permanent magnet assemblies for use in Magnetic Resonance Imaging (MRI) and/or Magnetic Resonance Therapy (MRT) to produce a volume of substantially uniform magnetic field in a restricted part of the patient's body in a region either adjacent to the surface of one permanent magnet assembly or between a set of a first and second permanent magnet assemblies, leaving open access to the patient's body. The assemblies consist of a plurality of annular concentric magnets spaced-apart along their axis of symmetry. A method for constructing such annular permanent magnetic assemblies is disclosed, using equi-angular segments permanently magnetized.

26 Claims, 11 Drawing Sheets

PERMANENT MAGNET ASSEMBLIES FOR USE IN MEDICAL APPLICATIONS

FIELD OF THE INVENTION

This invention relates to permanent magnet assemblies for use in medical applications and particularly to permanent magnet assemblies for use in Magnetic Resonance Imaging (MRI) and/or Magnetic Resonance Therapy (MRT) which produce a predetermined volume of substantially uniform magnetic field extending in a first direction beyond the surface of the permanent magnet assemblies.

BACKGROUND OF THE INVENTION

The principles of MRI are set forth in several patents such as U.S. Pat. No. 5,304,933, which is incorporated herein by reference. MRT, sometimes referred to as interventional MRI or intraoperative MRI, is the performance of an interventional medical procedure on a patient in an MRI system. During the procedure, a surgical instrument is inserted into a patient in order to perform the procedure at a predetermined site in the body. The MRT system is used in this case to monitor in quasi real-time the correct placement of the instrument and also to observe the nature and the extent of the effect of the intervention on the tissue.

In an MRI and/or MRT system a strong uniform magnetic field is required in order to align an object's nuclear spins along the z-axis of a Cartesian coordinate system having mutually orthogonal x-y-z axes. The required strong uniform magnetic field, used for full body imaging, is normally in the order of 0.1 to 2 Tesla. The image quality and the accuracy of an MRI and/or MRT system is dependent on the degree of uniformity of the strong uniform magnetic field. Uniformity is critical in MRI and/or MRT applications because if the strong uniform magnetic field is not properly uniform within the volume of interest, the desired discrimination between different elements, due to the finely controlled magnetic field gradient, will be subject to misinterpretation. Typically, the uniformity required for the strong uniform magnetic field is within the order of 10 ppm within the volume of interest. It is essential for MRT systems used in interventional procedures to be based on an open structure, so as to provide the physician easy access to the intervention site.

Presently, most MRI systems employ a large magnet, which effectively surrounds the whole body of the patient, to produce the strong uniform magnetic field. Such magnets are usually large superconductor resistive or permanent magnets, each of which is expensive and heavy. Further, the access to the patient in these cases is obstructed.

Attempts have been made to provide open magnets for interventional procedures by employing two spaced-apart Helmholtz superconductive coil assemblies. They provide only limited space between the assemblies allowing for constricted access by only one person, such as a surgeon. Moreover, they are large, massive, immobile and expensive. See U.S. Pat. No. 5,410,287 (Laskaris et al.) and U.S. Pat. No. 5,428,292 (Dorri et al.).

U.S. Pat. No. 4,875,485 (Matsutani) discloses an apparently more compact configuration, based on a pair of spaced-apart superconductive Helmholtz coil assemblies, arranged for movement relative to a platform carrying the patient. The access to the patient remains restricted in this case as well, due to the additional space occupied by the cryostat. Also, the movement of the coils independently of one another is impractical, because the superconducting properties of the coils require extreme precision in positioning of the two poles, in the absence of which the magnetic system quenches.

In comparison to superconductive systems, permanent magnets are less expensive, generate only a minimal unwanted fringe field and are not involved with liquefied gas handling or vacuum requirements. Open access MRI systems based on permanent magnets have been disclosed by U.S. Pat. No. 4,829,252 (Kaufman) and U.S. Pat. No. 5,134,374 (Breneman). Both are using a pair of opposing magnetic flat circular poles, employed one above the other, with the patient lying down between the magnets. The poles are mounted on end plates, supported by connecting members, which provide return paths for the magnetic flux. These systems are massive and immobile and the access to the patient is encumbered by the supporting structure.

A pair of opposing permanent magnet assemblies for use in MRI, each made of concentric magnetic rings, composed of a set of magnetic polygonal blocks, is disclosed in U.S. Pat. No. 5,332,971 (Aubert). Aubert teaches that the opposing concentric rings within each of the pairs of permanent magnets are to be spaced apart from each other the same distance. The magnet is massive, weighing about 3 tons and is therefore not amenable to movement relative to a patient's body.

In each of the above prior art magnets, used for providing the large uniform magnetic field for MRI and/or MRT applications, the magnetic field is generated in a first stage as uniformly as possible. More uniformity is achieved subsequently by shimming.

SUMMARY OF THE INVENTION

It is therefore an object of the present invention to provide a permanent magnet assembly for use in medical applications including MRI and/or MRT.

It is a further object of the present invention to provide a single annular permanent magnet assembly for use in medical applications including MRI and/or MRT applications which extends the volume of substantially uniform magnetic field in a region adjacent to the surface of the permanent magnet assembly.

It is a further object of the present invention to provide a single annular permanent magnet assembly allowing free access to the volume of substantially uniform magnetic field from the upper surface of the single annular permanent assembly.

It is a further object of the present invention to provide a single annular permanent magnet assembly, enabling insertion therethrough of a medical instrument in a direction substantially parallel to the direction of the uniform magnetic field.

It is a further object of the present invention to provide a first compact annular permanent magnet assembly which is connected to a second compact annular permanent magnet assembly through a connecting means for use in medical applications including MRI and/or MRT which extend the substantially uniform volume of magnet field in a region between the first and second permanent magnet assemblies allowing lateral access around the uniform volume.

It is a further object of the present invention to provide a permanent magnet assembly which is compact, light, inexpensive and movable with respect to a patient support.

It is yet a further object of the present invention to provide a method for constructing an annular permanent magnet assembly for use in an MRI and/or MRI device to produce a predetermined volume of substantially uniform magnetic field extending in a first direction beyond an upper surface of the permanent magnet assembly.

With these and other objects in view, the present invention contemplates a permanent magnet assembly for use in an MRI and/or MRT device to produce a predetermined volume of substantially uniform magnetic field extending in a first direction beyond an upper surface of the permanent magnet assembly. The permanent magnet assembly includes a first annular permanent magnet having an upper and a lower surface, the upper surface of the first annular permanent magnet being of a first magnetic polarity and the lower surface of the first annular permanent magnet being of a second magnetic polarity, the first annular permanent magnet having an inside diameter, the first annular permanent magnet having at least a portion of the upper surface of the first annular magnet lying in a first plane to provide a first magnetic field in the predetermined volume, the first magnetic field having a zero rate of change in the first direction perpendicular to the first plane at a first point in the predetermined volume. The permanent magnet assembly also including at least a second annular permanent magnet having an upper and a lower surface, the upper surface of the second annular permanent magnet being of the said first magnetic polarity and the lower surface of the second annular permanent magnet being of the said second magnetic polarity, the second annular permanent magnet having an outside diameter which is smaller than the inside diameter of the first annular permanent magnet, the second annular permanent magnet providing a second magnetic field. The permanent magnet assembly finally including low permeability material interconnecting the first annular permanent magnet with the second annular permanent magnet, so that at least a portion of the upper surface of the second annular permanent magnet is in a second plane spaced from the first plane, whereby the second magnetic field is superimposed on the first magnetic field, in the predetermined volume, having a zero rate of change in the first direction at a second point different from the first point. The low permeability material interconnecting the first annular permanent magnet and the second annular permanent magnet is preferably a high thermal conductivity material and is slotted in order to reduce eddy currents.

In one embodiment of the invention, a permanent magnet assembly for use in an MRI and/or MRT device is provided to produce a predetermined volume of substantially uniform magnetic field extending in a first direction beyond an upper surface of the permanent magnet assembly. The permanent magnet assembly includes an annular permanent magnet having an upper and a lower surface, the upper surface of the annular permanent magnet having a first portion thereof lying in the first plane to provide a first magnetic field in the predetermined volume, the first magnetic field having a zero rate of change in the first direction perpendicular to the first plane at a first point in the predetermined volume. The upper surface of the annular permanent magnet has a second portion thereof lying in a second plane forming a step and providing a second magnetic field in the predetermined volume, the second magnetic field having a zero rate of change in the first direction at a second point in the predetermined volume.

In another embodiment of the invention the upper surface of the first and second annular permanent magnets each comprise a plurality of steps. Each of the steps may be parallel to the first plane.

In another embodiment of the invention the upper surface of the first and second annular permanent magnets are each inclined with respect to the first plane.

In another embodiment of the invention the first and second annular permanent magnets are movably mounted in their permanent magnet assembly, their location along the axis of symmetry being determined by a set of adjustment screws.

In still another embodiment of the invention a magnetic structure for use in an MRI and/or MRT device is provided to produce a predetermined volume of substantially uniform magnetic field in a region including a first permanent magnet assembly having a first and a second surface and a second permanent magnet assembly having a first and a second surface. The structure further includes a mounting of low permeability material for mounting the first permanent magnet assembly at a first location with the first surface thereof facing one side of the region, and the second permanent magnet assembly at a second location with the first surface thereof facing the first surface of the first permanent magnet assembly on an opposite side of the region so that the region is between the first surfaces of the first and second permanent magnet assemblies, with lateral free access from around. The first permanent magnet assembly has a first annular permanent magnet with a first and a second surface. The first surface of the first annular permanent magnet is of a first magnetic polarity and the second surface of the first annular permanent magnet is of a second magnetic polarity. The first annular permanent magnet has an inside diameter. At least a portion of the first surface of the first annular magnet lies in a first plane to provide a first magnetic field in the region, the first magnetic field having a zero rate of change in a first direction at a first point in the region. The first magnet assembly also has at least a second annular magnet with a first and a second surface. The first surface of the second annular permanent magnet is of the said first magnetic polarity and the second surface of the second annular permanent magnet is of the said second magnetic polarity. The second annular permanent magnet has an outside diameter which is smaller than the inside diameter of the first annular permanent magnet, with at least a portion of the first surface of the second annular magnet lying in a second plane spaced from the first plane to provide a second magnetic field whereby the second magnetic field is superimposed upon the first magnetic field in the region, the second magnetic field having a zero rate of change in the first direction at a second point different from the first point. The second permanent magnet assembly has a third annular permanent magnet with a first and a second surface. The first surface of the third annular permanent magnet is of the second magnetic polarity and the second surface of the third annular permanent magnet is of the first magnetic polarity. The third annular permanent magnet has an inside diameter. The third annular permanent magnet has at least a portion of the first surface of the third annular magnet lying in a third plane to provide a third magnetic field, whereby the third magnetic field is superimposed upon the first and second magnetic fields in the region. The third magnetic field has a zero rate of change in the first direction at a third point different from the first and second points. The second magnet assembly also has at least a fourth annular magnet having a first and a second surface. The first surface of the fourth annular permanent magnet is of the second magnetic polarity and the second surface of the fourth annular permanent magnet is of the first magnetic polarity. The fourth annular permanent magnet has an outside diameter which is smaller than the inside diameter of the third annular permanent magnet, with at least a portion of the first surface of the fourth annular permanent magnet lying in a fourth plane spaced from the third plane to provide a fourth magnetic field whereby the fourth magnetic field is superimposed on the first, second and third magnetic fields in the region. The fourth magnetic field has a zero rate of change in the first direction at a fourth point different from the first, second and third points.

In another embodiment of the invention, the first and second annular permanent magnets are movably mounted in their respective permanent magnet assembly, their location along the axis of symmetry being determined by a set of adjustment screws. The third and fourth annular permanent magnets are movably mounted in their respective permanent magnetic assembly, their location along the axis of symmetry being determined by another set of adjustment screws.

In another embodiment of the invention, the first and second permanent magnet assemblies further include an outer casing capable of attachment to the mounting.

In another embodiment of the invention the mounting includes a frame, connected to a set of jaws by a movable screw. The movable screw may be moved so as to rotate one or more of the jaws around an axis passing along the screw, thereby allowing broader access to a patient's body part positioned between the first and second permanent magnet assemblies.

In another embodiment of the invention the frame is controlled by a MRI compatible motor so that the frame moves in a series of horizontal positions, so that a composite image is formed.

In another embodiment of the invention the motor control of the frame displaces the first and second permanent magnet assemblies in an axial direction to bring the first and second permanent magnet assemblies either closer together or farther apart from each other.

In accordance with the method of this invention a permanent magnet assembly is constructed for use in an MRI and/or MRT device to produce a predetermined volume of substantially uniform magnet field in a region. The method includes selecting segments from a batch of equi-angular segments, manufactured to have the same magnetization, so that variations in a magnetic field of adjacent segments caused by inherent manufacturing inaccuracies follow a cyclic curve having a regular period. The method also includes combining the segments to form a first annular permanent magnet. The first annular permanent magnet has a first and a second surface thereof.

In another embodiment of the method, the method includes selecting segments from a batch of equi-angular segments, manufactured to have the same magnetization, so that variations in a magnetic field of adjacent segments caused by inherent manufacturing inaccuracies follow a cyclic curve having a regular period and combining the segments to form a second annular permanent magnet. The second annular permanent magnet has a first and a second surface thereof. The first and second annular magnets are then interconnected with a low permeability material so as to form a first permanent magnet assembly.

In another embodiment of the method, the method includes selecting segments from a batch of equi-angular segments, manufactured to have the same magnetization, so that variations in a magnetic field of adjacent segments caused by inherent manufacturing inaccuracies follow a cyclic curve having a regular period. The method also includes combining the segments to form a third annular permanent magnet. The third annular permanent magnet has a first and a second surface thereof.

In another embodiment of the method, the method includes selecting equi-angular segments from a batch of segments, manufactured to have the same magnetization, so that variations in a magnetic field of adjacent segments caused by inherent manufacturing inaccuracies follow a cyclic curve having a regular period and combining the segments to form a fourth annular permanent magnet. The fourth annular permanent magnet has a first and a second surface thereof. The third and fourth annular magnets are then interconnected with a low permeability material so as to form a second permanent magnet assembly.

In another embodiment of the method, the method includes forming a magnetic structure by mounting the first permanent magnet assembly on a mounting of low permeability material at a first location with the first surface thereof facing one side of the region, and the second annular permanent magnet at a second location with the first surface thereof facing the first surface of the first annular permanent magnet on an opposite side of the region. The region is between the first surfaces of the first and second annular permanent magnets. The method still further includes positioning the complementary annular permanent magnets so that the respective cyclic curves are in anti-phase with each other, whereby the variations in magnetic fields of adjacent segments from an average given value cancel each other out to produce a substantially uniform magnetic field in the region.

DESCRIPTION OF THE DRAWINGS

In order to understand the invention and see how it may be carried out in practice, several preferred embodiments will now be described, by way of non-limiting example only, with reference to the accompanying drawings, in which.

DETAILED DESCRIPTION OF THE INVENTION

The present invention is based, in part, upon the realization that whole body imaging is not necessary for the performance of an interventional medical procedure on a patient in an MRI system. It has been realized that, in fact, a machine with a restricted field of view performs satisfactorily in such a setting and can be built in a more efficient and economical fashion than one built for accommodating a whole body. Furthermore, in order to leave an open access to reach conveniently the part of the body on which the intervention is performed, the invention is concerned with assemblies that are compact and also do not incorporate ferromagnetic structures for the creation of return paths of the magnetic flux.

In accordance with this invention, permanent magnet assemblies, each formed from a plurality of annular concentric permanent magnets provide a volume of substantially uniform magnetic field extending from a central portion thereof.

The field strength of a single annular permanent magnet along a z-axis perpendicular to its face and passing through its center is given by the following expression, using the center of the permanent magnet as the origin of the coordinate system:

$$\dot{B}(z) = \frac{\mu_0 \mu \Phi}{2} \left( \frac{z+h/2}{\sqrt{(z+h/2)^2 + b^2}} - \frac{z-h/2}{\sqrt{(z-h/2)^2 + b^2}} - \frac{z+h/2}{\sqrt{(z+h/2)^2 + a^2}} + \frac{z-h/2}{\sqrt{(z-h/2)^2 + a^2}} \right)$$

where:

$\mu_0$ is the permeability of air $\mu$ is the permeability of the annular permanent magnet $\Phi$ is the magnetization a is the inner radius of the annular permanent magnet b is the outer radius of the annular permanent magnet h is the height of the annular permanent magnet The uniformity of the magnetic field in the volume is based on the fact that any annular single permanent magnet has one point on its axis and located outside its own plane, of maximum or minimum field strength, so that the derivative of the field strength with respect to the z-axis there is zero (i.e. dB/dz=0). It has been realized that by displacing the upper surfaces of a plurality of concentric annular permanent magnets in the assembly from each other, the respective points of zero derivative can be displaced from each other, allowing the magnetic field in the volume to be made uniform to within a defined tolerance by superimposing each of the curves describing the field strength one on top of each other, so that the point of zero derivative of one curve is superimposed on top of the descending or ascending part of the other. In a like manner the upper surfaces themselves can be created with steps to provide additional displaced points of zero derivative.

The permanent magnet assemblies of this invention can be used in various ways. One way of use is to construct a single permanent magnet assembly by itself, to provide the uniform magnetic field adjacent to the upper surface thereof.

Figure 1:
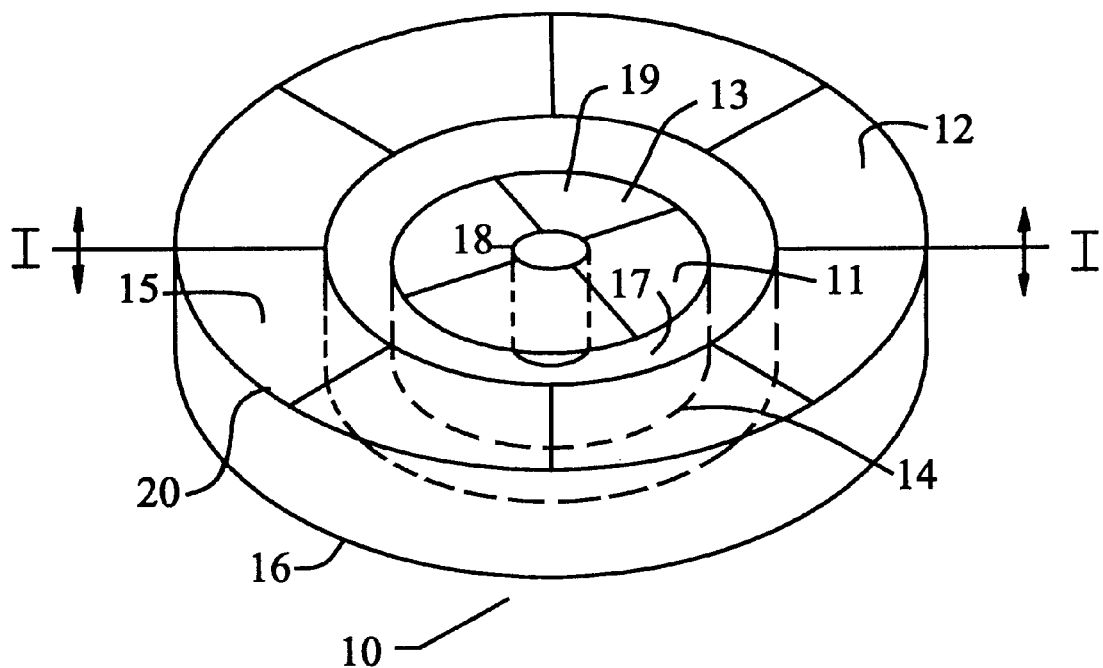
FIG. 1 is a pictorial perspective view of one segmented permanent magnet assembly according to the invention.
Figure 2:
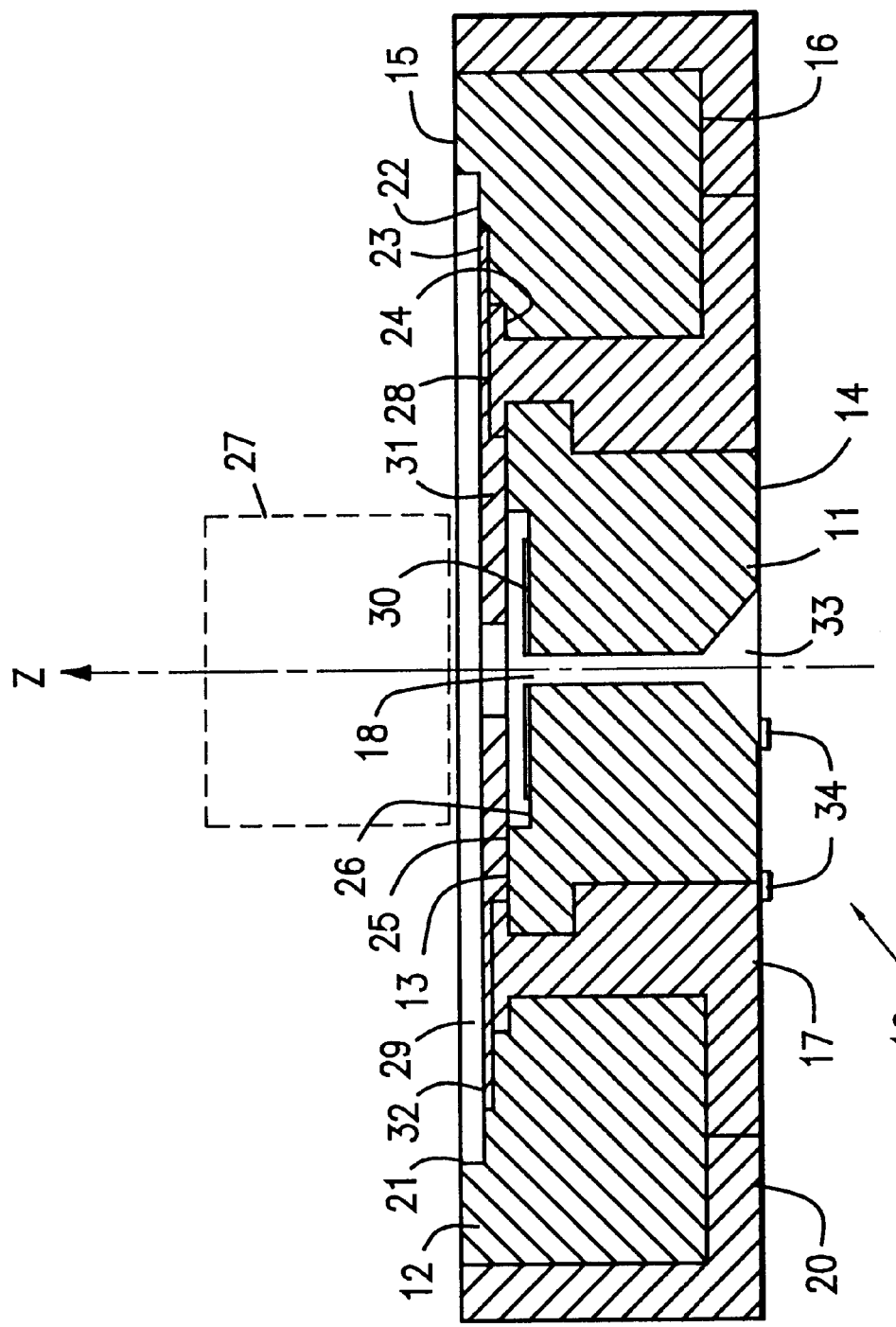
FIG. 2 is a half cross-sectional view through the line I—I in FIG. 1.

FIGS. 1 and 2, taken together, show pictorially one embodiment of the invention wherein a permanent magnet assembly 10 comprises inner and outer aligned annular permanent magnets 11 and 12 formed of Neodymium-Iron-Boron. The annular permanent magnets 11 and 12 are preferably concentric. The inner annular permanent magnet 11 has a first surface 13 lying in a first plane and a second surface 14 lying in a different plane, each plane being parallel to the x-y plane of the permanent magnet assembly 10. The outer annular permanent magnet 12 has a first surface 15 lying in a second plane and a second surface 16 lying in a different plane, each plane being parallel to the x-y plane of the permanent magnet assembly 10. The inner and outer annular permanent magnets 11 and 12 are interconnected by an intermediate annular band 17 of low permeability material which holds them with their north and south poles aligned in the same direction.

The complete structure comprising the inner annular permanent magnet 11, the outer annular permanent magnet 12 and the intermediate annular band 17 is supported by a support annular band 20 formed of low permeability material surrounding the outer annular permanent magnet 12. If desired, the support annular band 20 may be integral with the intermediate annular band 17, as shown in FIG. 2.

Referring particularly now to FIG. 2, a cross-section of the permanent magnet assembly 10 taken through the line I—I in FIG. 1 the first surface 15 of the outer annular permanent magnet is stepped such that a periphery 21 of the outer annular permanent magnet 12 is higher than successive intermediate portions 22, 23 and 24. Similarly, the first surface 13 of the inner annular permanent magnet 11 has a periphery 25 higher than an intermediate portion 26 thereof. The permanent magnet assembly 10 provides a volume 27 of substantially uniform magnetic field which is adjacent to its upper surface. Uniformity of the magnetic field in the volume 27 is based on the fact that any annular permanent magnet has one point where the derivative of the field strength with respect to the z-axis is zero (i.e. dB/dz=0), in a first direction perpendicular to the face of the magnet. In order to achieve the desired uniformity in the magnetic field of volume 27, the first surface 15 of the outer annular permanent magnet 12 is provided with steps 21, 22, 23, 24 and the first surface 13 of the inner annular permanent magnet 11 is provided with steps 25 and 26 constituting thereby a set of contiguous adjacent annular permanent magnets. Thus, each step produces an additional displaced point of zero derivative on the z-axis, riding on the ascending or descending parts of the curves describing the field strength generated by other steps. Consequently, the permanent magnet assembly 10 provides to the volume 27 a plurality of points for which dB/dz=0, such that the volume 27 of the magnetic field is substantially uniform.

A circular bore 18, its axis constituting the z-axis of the permanent magnet assembly 10, is formed in the inner annular permanent magnet 11 for allowing access from below therethrough of a medical instrument and for allowing an increased length of the medical instrument to protrude from the first surface 13 of the inner annular permanent magnet 11, when the permanent magnet assembly 10 is used in an MRT application. The circular bore 18 is provided with a conical recess 33 in the second surface 14 of the inner annular permanent magnet 11 of the permanent magnet assembly 10, for partially accommodating the medical instrument. Complete free access is allowed to the volume 27, when the volume is approached by the medical instrument from above.

In another embodiment of the invention the inner annular permanent magnet 11 has a series of continuous steps such that the steps take the form of an incline. The incline is also possible on the steps of the outer annular permanent magnet 12.

Figure 3:
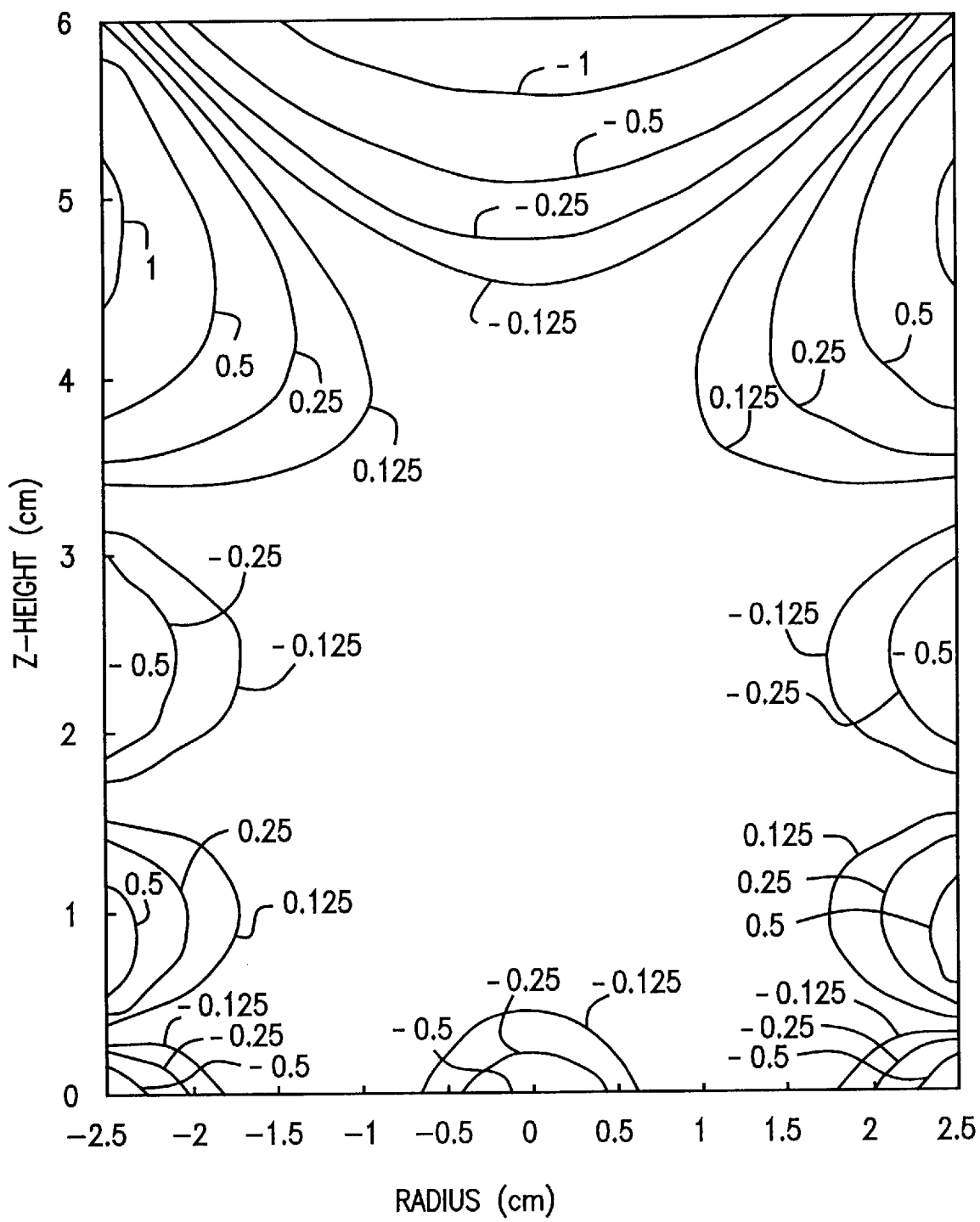
FIG. 3 is a representation of the two dimensional distribution of the magnetic field strength of the permanent magnet assembly of FIG. 1.

It has been found that a magnetic field with a uniformity of approximately 1000 ppm can be achieved prior to shimming, with a permanent magnet assembly 10 as shown in FIGS. 1 and 2. FIG. 3 shows the uniformity (in percentage) of the magnetic field generated by a 30 cm.

diameter permanent magnet assembly. The volume 27 in which the uniformity is 1250 ppm or less is a cylinder adjacent to the upper face of the assembly 4.5 cm. in height, with a diameter of 2 cm. The field strength is 785 Gauss.

However, the uniformity of magnetic field strength of the volume 27 can be improved by means of "shimming". There are standard shimming techniques, well-known to those skilled in the art of magnet design, referred to as "passive shimming" and "active shimming".

Passive shimming can improve the magnetic field uniformity from orders of approximately 1000 ppm to orders of approximately 100 ppm. Active shimming can improve the magnetic field uniformity from orders of approximately 100 ppm to orders of approximately 10 ppm and less.

Passive shimming is achieved by disposing shaped fragments 30 of magnetic material of various polarities, of mumetal, or of soft iron on, for example, the intermediate portion 26 of the inner annular permanent magnet 11 underneath a multi-layer printed circuit board 32.

Active shimming is achieved by printing shim coils 31 on several layers of the separate layers of the multi-layer printed circuit board 32, the other layers housing the gradient and RF coils, used ordinarily in MRI systems. The multi-layer circuit board is seated in the recess 29, which is defined by the area between the intermediate portion 23 of the outer annular permanent magnet 12, the first surface 28 of the intermediate annular band 17 and above the first surface 13 of the inner annular permanent magnet 11. The multi-layer printed circuit board 32 is thus above the intermediate portion 26 of inner annular permanent magnet 11 and does not touch it. The uniformity of the magnetic field may be further improved by disposing fragments 34 of magnetic material of various polarities, mumetal or soft iron on, for example, the second surface 14 of the inner annular permanent magnet 11.

In another embodiment of the invention not shown in the drawings, the support annular band 20 and the intermediate annular band 17 are shaped so as to allow the coaxial annular permanent magnets 11 an 12 to be finely displaced and mutually offset along the common z-axis, so as to achieve shimming. In this case, each of the coaxial annular permanent magnets 11 and 12 is connected to a low permeability lower plate via a plurality of radially spaced-apart adjustment screws, attached to and cooperating with the annular permanent magnets 11 and 12. Thus, the turning of the screws a small amount in either clockwise or counter-clockwise direction moves the corresponding annular permanent magnet (i.e. 11 or 12) toward or away from the low permeability lower plate and consequently corrects the non-uniformity in the volume 27 of uniform magnetic field to a desired degree.

The permeability of the annular permanent magnets 11 and 12, is temperature dependent so that temperature control can be a method of shimming. A deviation of 1° C. in the magnet temperature generates a change of 1000 ppm in the magnetic field strength. Each annular permanent magnet 11 and 12 has a temperature stabilization means for maintaining a substantially constant temperature of the respective permanent magnet and for varying it thereof for achieving shimming. The means consists of a heater and of a feedback circuit which controls the temperature.

It will be appreciated that modifications to the basic structure of the permanent magnet assembly 10 will be apparent to those skilled in the art, without departing from the spirit of the invention. For example, it is understood that other annular permanent magnet assemblies besides annular permanent magnets 11 and 12 may be employed. Also the size of the annular permanent magnets can vary according to the need.

Additional annular permanent magnets can be inserted between the inner and outer annular permanent magnets 11 and 12, preferably such that an intermediate support means of low permeability material is inserted between each adjacent annular permanent magnet. However, in the extreme embodiment where an external dimension of an internal annular permanent magnet is equal to an internal dimension of an adjacent, external annular permanent magnet, so that the two annular permanent magnets are contiguous, the permanent magnet assembly 10 behaves as though the two contiguous annular permanent magnets are a single structure. In either case, the desired volume 27 of uniform magnetic field is still achieved.

A common problem with magnets is the generation of eddy currents. Eddy currents are induced by momentarily changing the magnetic field as the gradient field is formed. The eddy currents in turn produce a separate magnetic field in the volume 27 of uniform magnetic field. In order to reduce eddy currents, both the inner and outer annular permanent magnets 11 and 12 are formed of segments 19, each of which is permanently magnetized in a known manner and then attached to a neighboring segment, using a non-conductive glue.

Further, it is possible that local heating could be problematic, thus the intermediate annular band 17 may be formed of high thermal conductivity material so as to dissipate heat and reduce heat buildup. In an embodiment where the intermediate annular band 17 is itself formed of electrically conductive material, it too may be slotted radially so as to reduce eddy currents.

Figure 4:
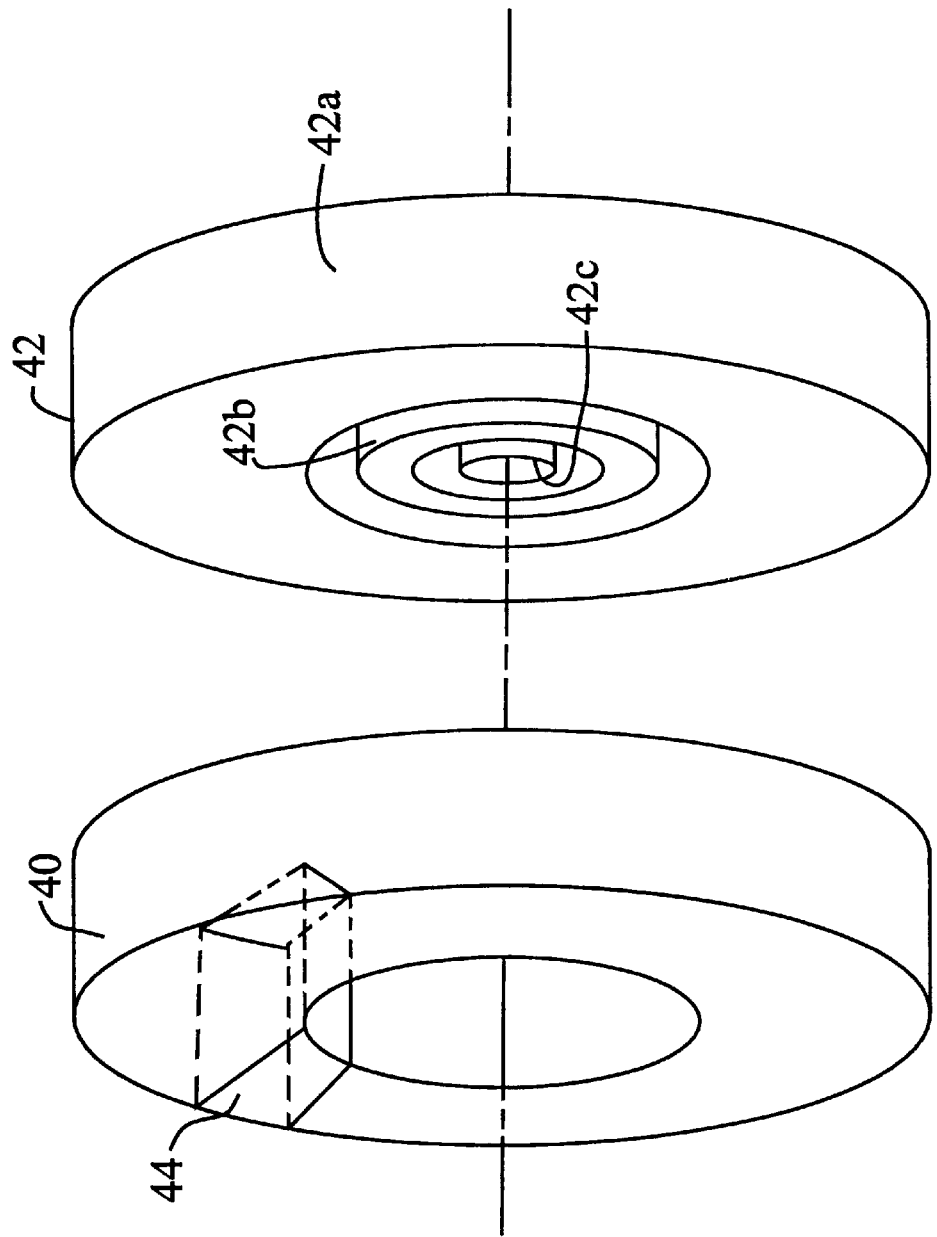
FIG. 4 is a pictorial representation of a first and a second permanent magnet assembly.

Another way to use the permanent magnet assemblies is in opposed pairs, to form the uniform magnetic field therebetween. FIG. 4 is a pictorial representation of a set of first and second permanent magnet assemblies 40 and 42 each consisting of three concentric annular permanent magnets 42a, 42b, 42c and 40a, 40b, 40c (not shown in the drawing). Each permanent magnet assembly is formed of segments 44, electrically insulated from a neighboring segment so as to reduce eddy currents.

Figure 5:
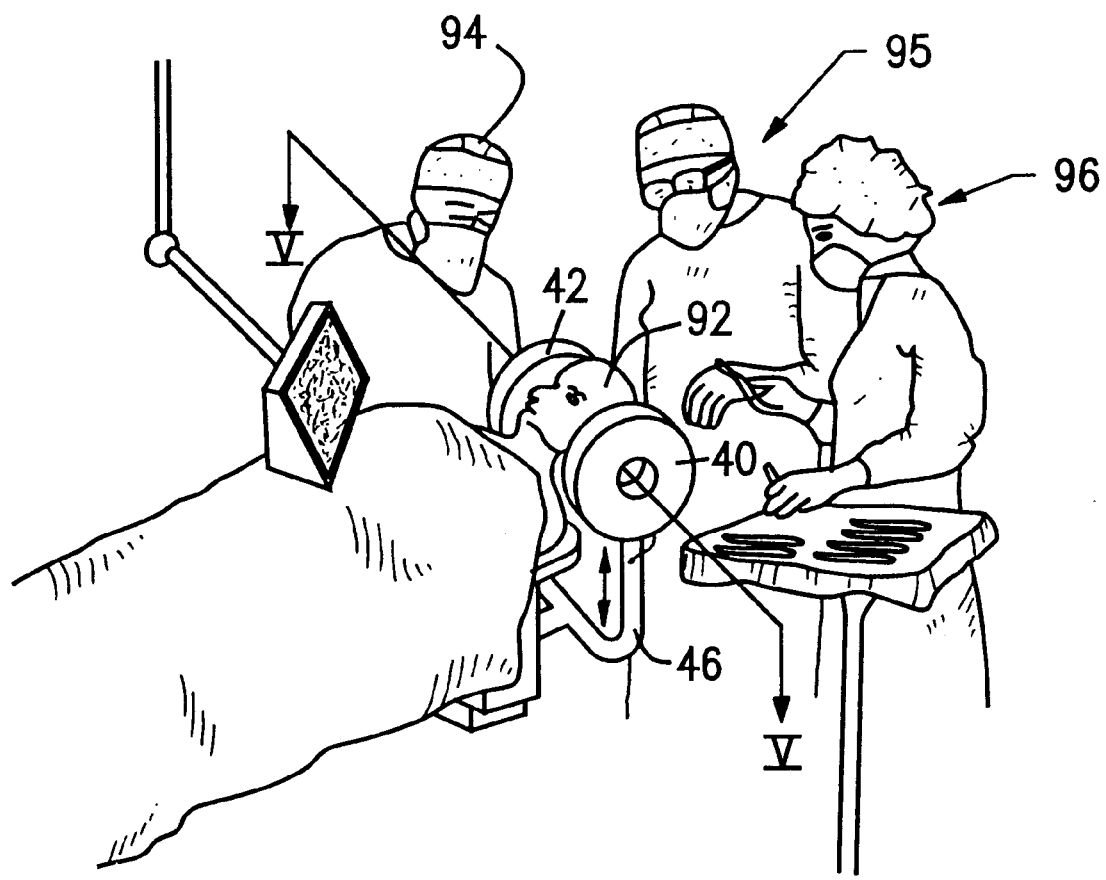
FIG. 5 is a pictorial perspective view of the first and second permanent magnet assemblies connected via a frame used for brain surgery.

FIG. 5 shows pictorially details of the pair of permanent magnet assemblies 40 and 42 joined together via the frame 46 being shaped for imaging a patient's brain 92, as manipulated by a plurality of surgeons 94 and 95 and a nurse 96. The pair of permanent magnet assemblies 40 and 42 joined together via a frame 46 define a region 54 having a volume 27 of substantially uniform magnetic field, between the pair of permanent magnet assemblies 40 and 42.

Figure 6:
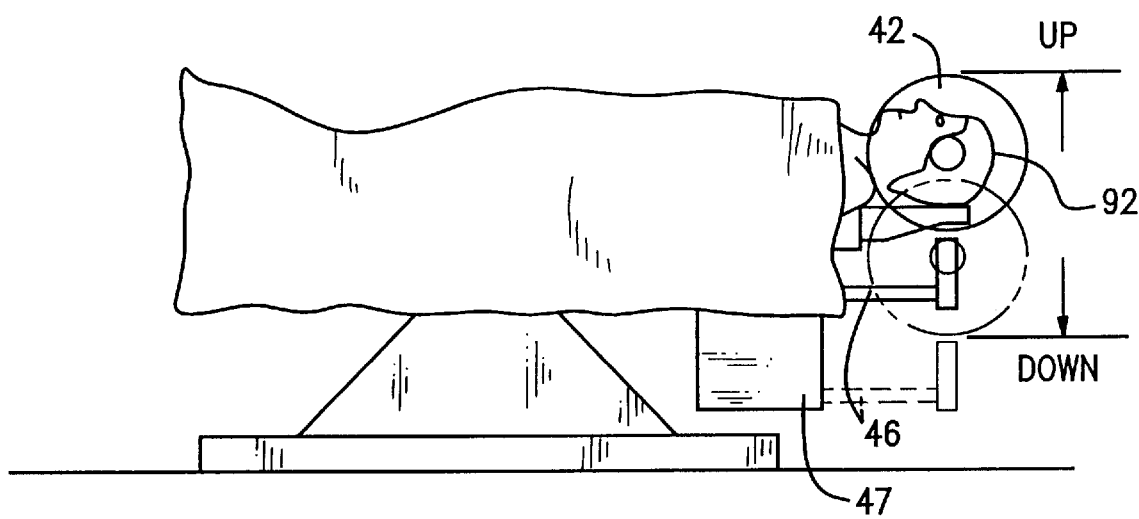
FIG. 6 is a pictorial perspective view of the first and second permanent magnet assemblies shown functionally in FIG. 5, used for performing composite imaging.

FIG. 6 is a pictorial side view of the pair of permanent magnet assemblies 40 and 42 connected via a frame 46, shown pictorially in FIG. 5, used for performing composite imaging. The pair of permanent magnet assemblies 40 and 42 may be moved as a whole in the three directions x, y, and z by a MRI compatible motor control unit 47, to shift the region 54 of volume 27 of uniform magnetic field and thus perform MRI and/or MRT on different regions of the patient's brain 92. Thus, the volume 27 of uniform magnetic field is shifted in relation to a patient placed between the pair of permanent magnet assemblies 40 and 42. In use, the pair of permanent magnet assemblies 40 and 42 connected via the frame 46 is placed in a first position to produce a first image over a small field of view. The pair of permanent magnet assemblies 40 and 42 connected via the frame 46 is then moved by the motor control unit 47, for example in the up and down directions, so as to produce a series of spatially offset images. These separate spatially offset images are then combined to form a composite image, having a larger field of view.

Figure 7:
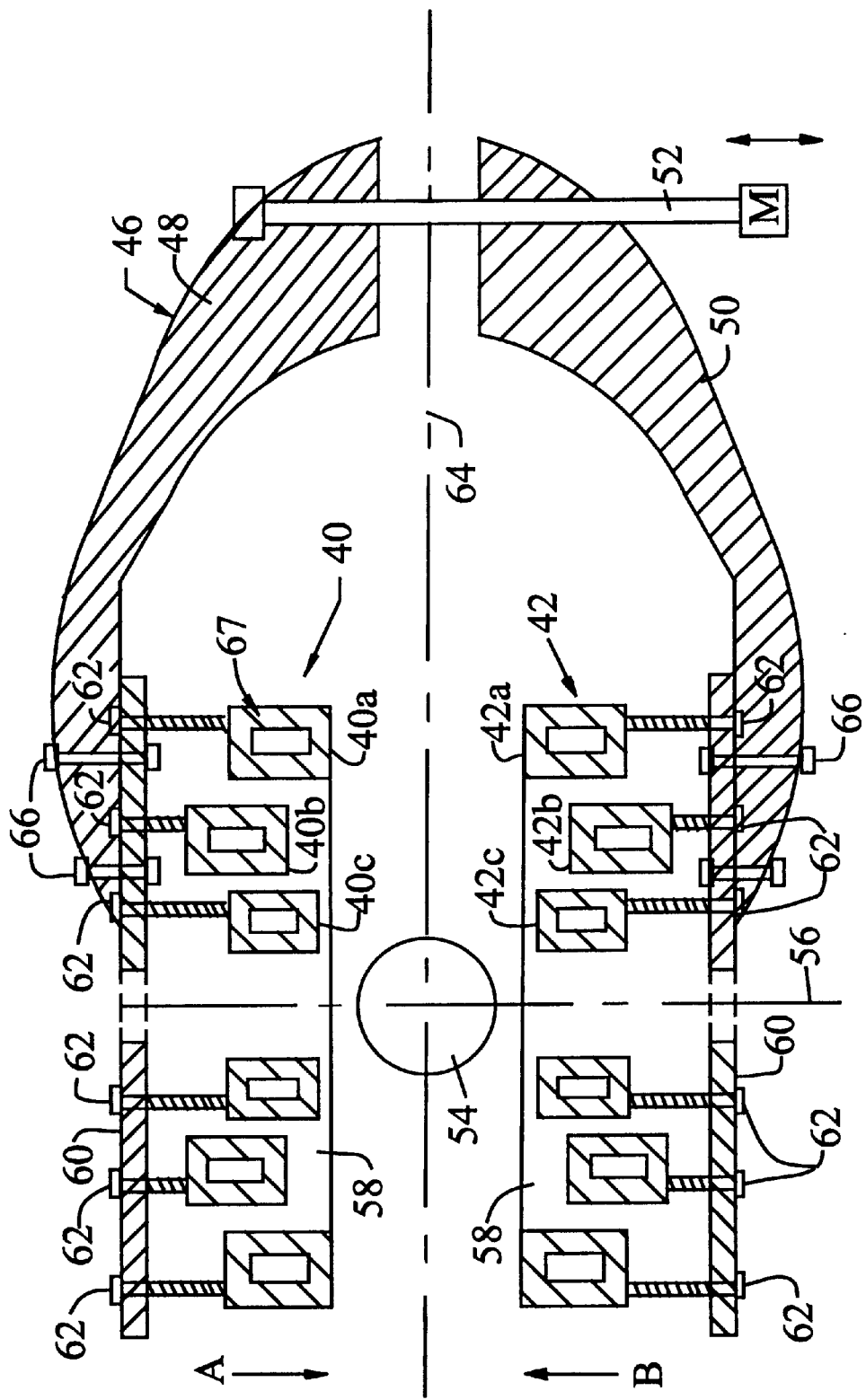
FIG. 7 is a cross-sectional view through the first and second permanent magnet assemblies and connecting means of FIG. 5.

FIG. 7 is a detailed cross-sectional view through the pair of permanent magnet assemblies 40 and 42 along the line V—V in FIG. 5. The frame 46 comprises a set of two symmetrically mounted jaws 48 and 50 joined at an end by a screw 52. An MRI compatible motor designated M is attached to the screw 52 to provide displacement of each of the permanent magnet assemblies 40 and 42 as a whole in an axial direction, to bring the permanent magnet assemblies 40 and 42 either closer together or further apart, for shimming purposes.

Each of the permanent magnet assemblies 40 and 42 includes a plurality of coaxial annular permanent magnets 40a, 40b, 40c and 42a, 42b, 42c which are designed to provide the required volume 27 of uniform magnetic field within a region 54 between the pair of permanent magnet assemblies 40 and 42. Each of the annular permanent magnets 40a, 40b, 40c and 42a, 42b, 42c is enclosed in a low permeability material casing 67. It will be noted that FIG. 7 shows only three coaxial annular permanent magnets, for the sake of illustration and description.

Each of the coaxial annular permanent magnets 40a, 40b, 40c and 42a, 42b, 42c is coaxial with a common axis 56 of the corresponding pair of permanent magnet assemblies 40 and 42, respectively. However, the coaxial annular permanent magnets 40a, 40b, 40c and 42a, 42b, 42c themselves are mutually offset along the common axis 56.

The contribution of each annular permanent magnet to the overall field strength combines to generate a plurality of locations of zero derivative in the z-direction allowing the magnetic field in the volume to be made uniform to within a defined tolerance. The overall field strength along the z-axis 56 of each permanent magnet assembly 40 and 42 is given by:

$$B(z) = \frac{\mu_0 \Phi}{2} \sum_i \mu_i \left( \frac{\Delta z_i + h_i/2}{\sqrt{(\Delta z_i + h_i/2)^2 + b_i^2}} - \frac{\Delta z_i - h_i/2}{\sqrt{(z_i - h_i/2)^2 + b_i^2}} - \frac{\Delta z_i + h_i/2}{\sqrt{(\Delta z_i + h_i/2)^2 + a_i^2}} + \frac{\Delta z_i - h_i/2}{\sqrt{(z_i - h_i/2)^2 + a_i^2}} \right)$$

where:

$\Delta z_i = z - z_{0i}$ is the transverse separation, along the symmetry axis 56, of z and $z_{0i}$, a point located midway between the upper and lower surfaces of the $i^{th}$ annular permanent magnet $\Phi$ is the magnetization $\mu_0$ is the permeability of air $\mu_i$ is the permeability of the $i^{th}$ annular permanent magnet $a_i$ is the inner radius of the $i^{th}$ annular permanent magnet $b_i$ is the outer radius of the $i^{th}$ annular permanent magnet $h_i$ is the height of the $i^{th}$ annular permanent magnet the direction of the z axis for each permanent magnet assembly is towards the volume 27 of uniform magnetic field. The overall field strength is a superposition of the field strengths generated by each assembly.

Each of the coaxial annular permanent magnets 40a, 40b, 40c and 42a, 42b, 42c is fixed to an outer casing 60 via a plurality of radially spaced apart set screws 62, attached to the magnets enclosures 67, cooperating with the respective coaxial enclosures 67 of the annular permanent magnets 42a, 42b, and 42c, for achieving shimming of the permanent magnet assembly 42. It is apparent, as noted above, that the coaxial annular permanent magnets 42a, 42b, 42c are mutually offset along the common axis 56 so as to achieve shimming. Thus, turning of the set screws 62 a small amount in either clockwise or counter-clockwise direction moves the corresponding coaxial annular permanent magnet (i.e. 42a, 42b, 42c etc.) toward or away from the outer casing 60 of the permanent magnet assembly 42 and consequently corrects the non-uniformity in the region 54 of volume 27 of uniform magnetic field to a desired degree.

The free end of the jaws 48 and 50 is fixed to the outer casing 60 of the permanent magnet assemblies 40 and 42 by means of a plurality of fixing bolts 66. The whole structure 46 can be translated along the x, y and z axis by the motor control unit 47 not shown in FIG. 8. Moreover, each of the jaws 48 and 50 may be rotated away from its opposing jaw by the motor control unit 47, around an axis passing along screw 52, to allow the surgeon to have complete free access to one side of the patient. The bolts 66 may also be displaced, so that the respective pair of permanent magnet assemblies 40 and 42 may be moved in the direction of arrows A and B and thus accomplish shimming.

Figure 8:
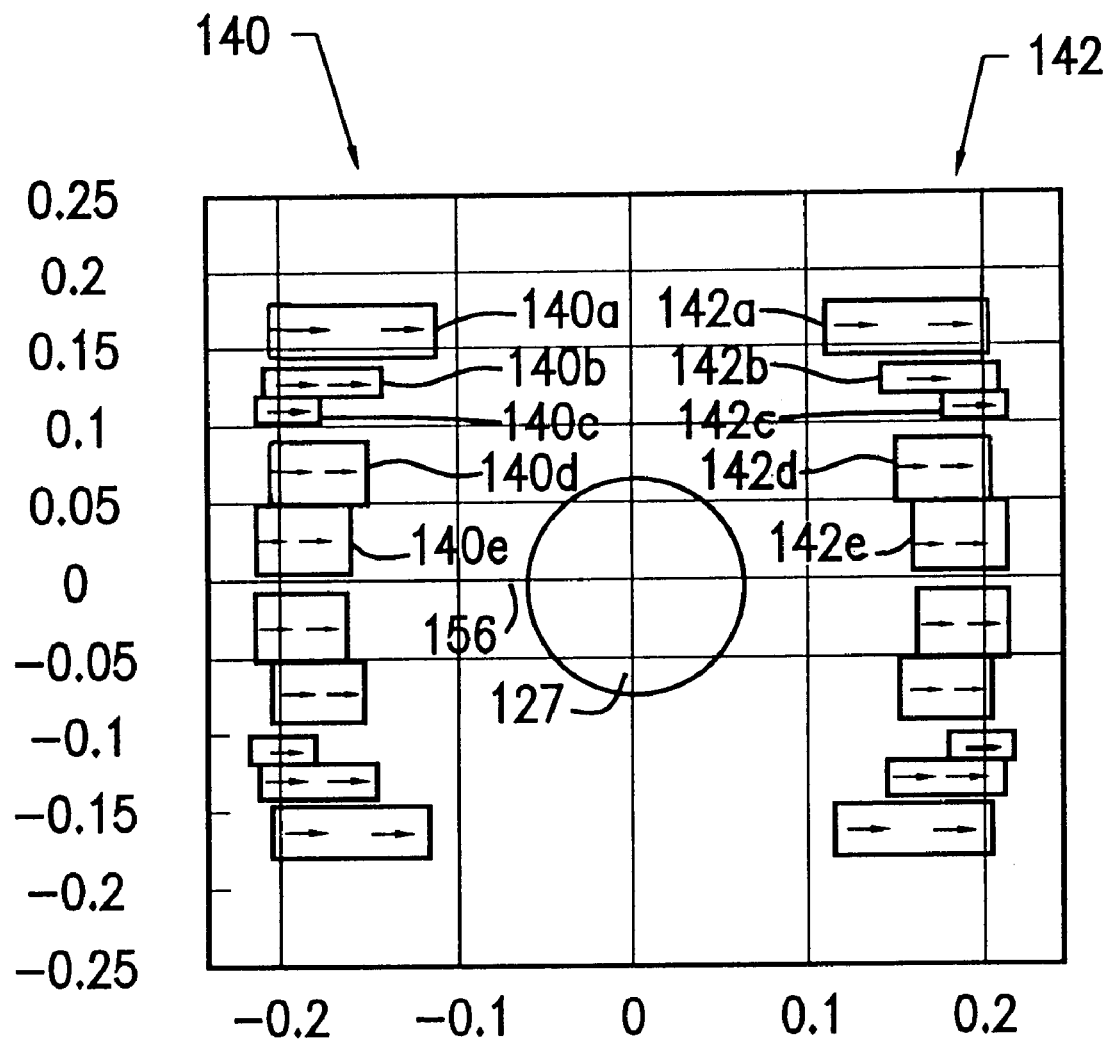
FIG. 8 is a schematic representation of first and second permanent magnet assemblies in which each permanent magnet assembly has five annular ring magnets.

FIG. 8 is a schematic representation of an embodiment of the invention including five coaxial annular permanent magnets 140a, 140b, 140c, 140d, 140e and 142a, 142b, 142c, 142d, 142e of the pair of permanent magnet assemblies 140 and 142. The dimensions of the five coaxial annular permanent magnets are shown in meters. The magnetic polarity of the coaxial annular permanent magnets creates a volume 127 of homogenous magnetic field in the direction of arrow B.

Inasmuch as the pair of permanent magnet assemblies 40 and 42 are identical in the embodiment thus far as described in FIG. 7, only one permanent magnet assembly containing five coaxial annular permanent magnets will be described in detail. However, it is understood that the pair of permanent magnet assemblies 140 and 142 need not be identical. Rather, the pair of permanent magnet assemblies 140 and 142 can have an unequal number of annular permanent magnets.

Thus, in FIG. 8, the coaxial annular permanent magnets 140, 140b, 140c, 140d, 140e in the permanent magnet assembly 140 may be finely displaced for shimming either towards or away from the complementary coaxial annular permanent magnets 142a, 142b, 142c, 142d, and 142e in the opposing permanent magnet assembly 142 along the common axis 156. An air gap of approximately 5 mm. is provided between the adjacent coaxial annular permanent magnets 140a and 140b with an increased air gap of approximately 10 mm. provided between the adjacent coaxial annular permanent magnets 140c and 140d. The remaining adjacent coaxial annular permanent magnets 140b, 140c and 140d, 140e are contiguous. Further, the overall average displacement between the pair of permanent magnet assemblies 140 and 142 is approximately 25 cm. and their approximate radius is 18 cm. The two opposing magnets weigh together 120 kg. The diameter of the spherical volume 127 of uniform magnetic field is 16 cm.

Figure 9:
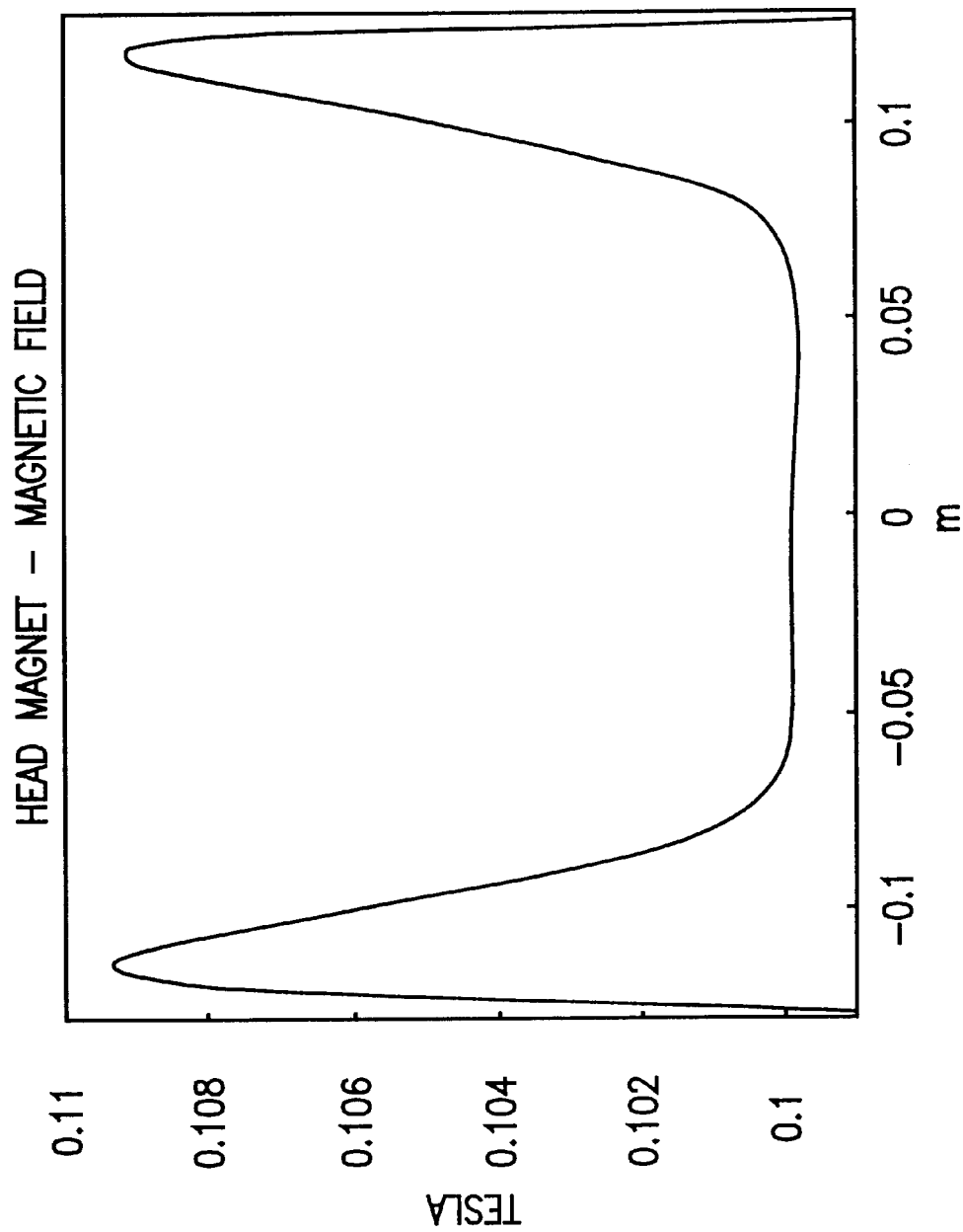
FIG. 9 is a graph showing the magnetic field strength as a function of displacement along the z-axis between the first and second permanent magnet assembly of FIG. 8.
Figure 10:
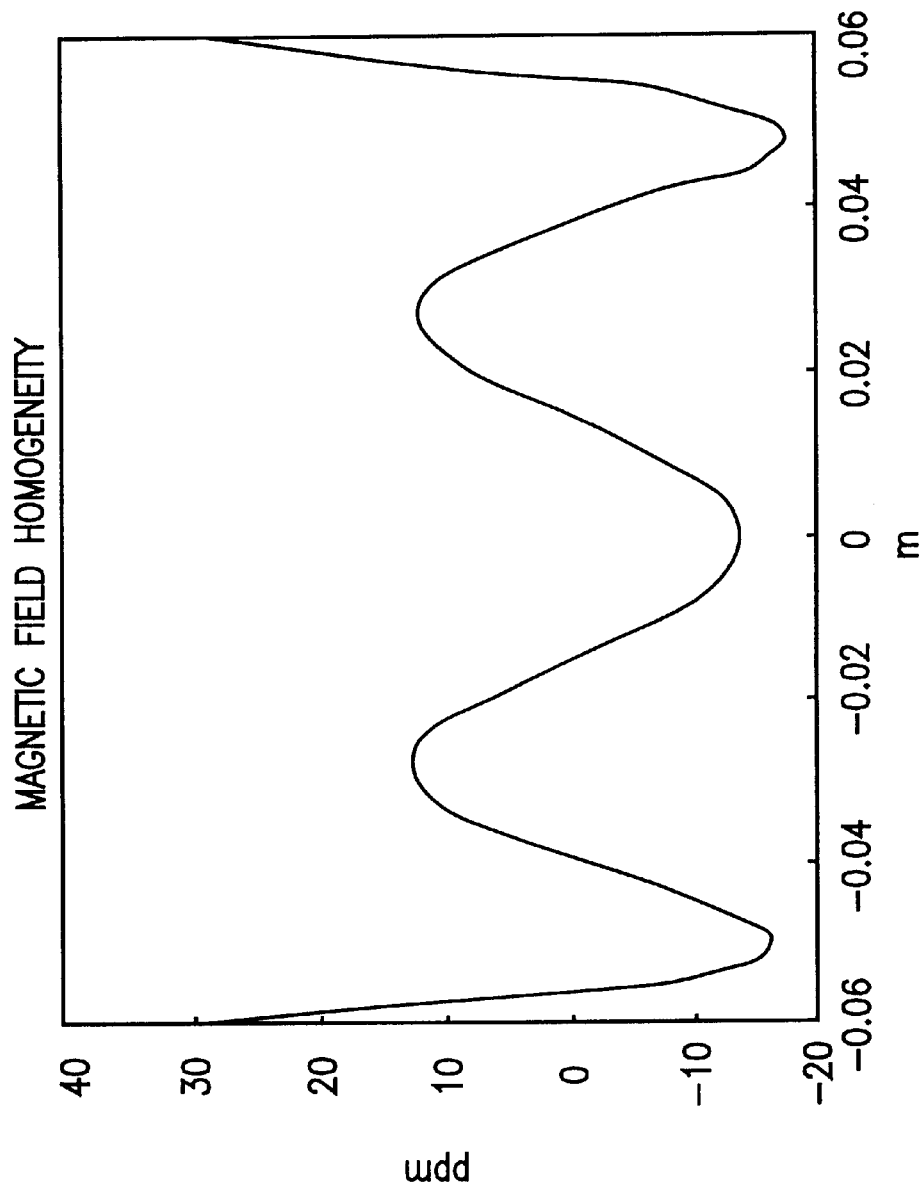
FIG. 10 is a graphical representation showing the deviation from uniform magnetic field along the z-axis between the first and second permanent magnet assembly of FIG. 8.

FIG. 9 is a graph showing magnetic field strength as a function of displacement along the z-axis, at a given value of y. It is seen that the field strengths of the opposing permanent magnet assemblies 40 and 42 superimpose so as to form a region 54 of a volume 27 of substantially homogenous magnetic field having a magnitude of approximately 1000 Gauss. FIG. 10 is a graphical representation of the magnetic field in volume 27 along the z-axis, showing the uniformity in ppm.

The effect of superposition of curves having spaced apart maxima is illustrated.

As noted above, a particular design feature of the permanent magnet assembly 10 is the ease with which shimming may be used to achieve a volume 27 of very high magnetic field uniformity typically to within several ppm.

Figure 11:
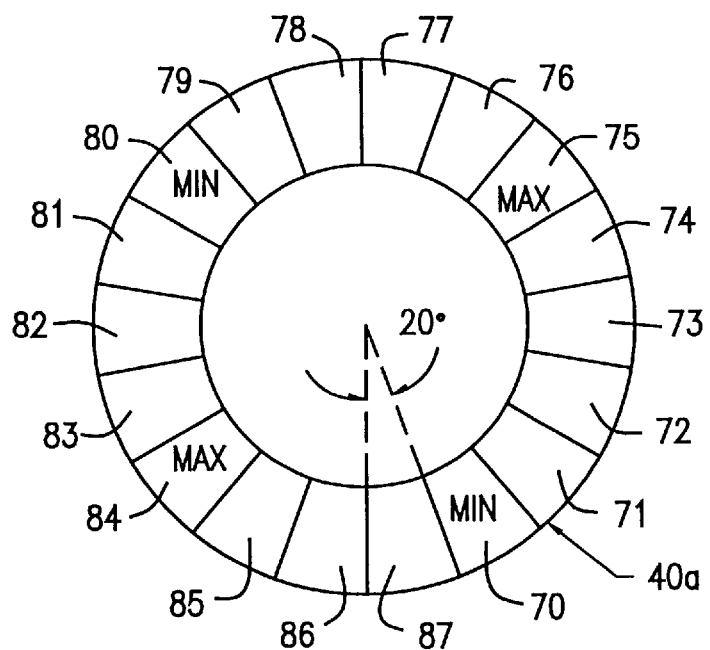
FIG. 11 shows schematically a detail of the segmented construction of the first and second permanent magnet assemblies, according to a preferred embodiment of the invention.

FIG. 11 shows schematically a detail of the construction of the coaxial annular permanent magnet 40a. Each coaxial annular permanent magnet comprises eighteen permanently magnetized segments 70 to 87 which are supplied in batches and are normally guaranteed by the manufacturer to have a peak to peak variation in magnetic field of 1%. The segments 70 to 87 each subtend an angle of 20° at the center of the coaxial annular permanent magnet 40a and are joined by an electrically non-conductive adhesive so as to reduce eddy currents, as explained above.

Owing to the slight difference in magnetic field between different segments 70 to 87 in each batch, it is often difficult to achieve a volume 27 of even a coarse magnetic field uniformity in the region 54 between a pair of opposing permanent magnet assemblies 40 and 42. It will be understood that at least a coarse magnetic field uniformity is a prerequisite to the fine tuning achieved using passive and active shimming.

Figure 12A:
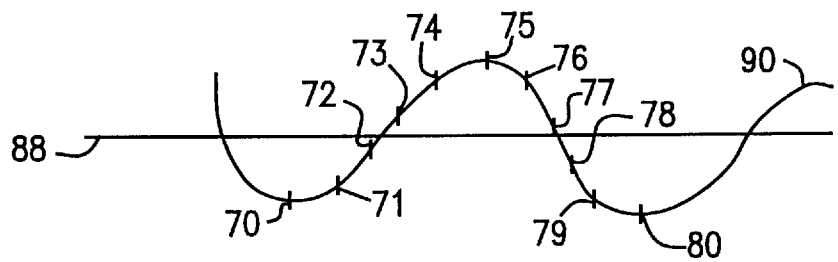
FIGS. 12a and 12b show graphically a preferred mutual disposition of opposing first and second permanent magnet assemblies having complementary magnetic field variations.
Figure 12B:
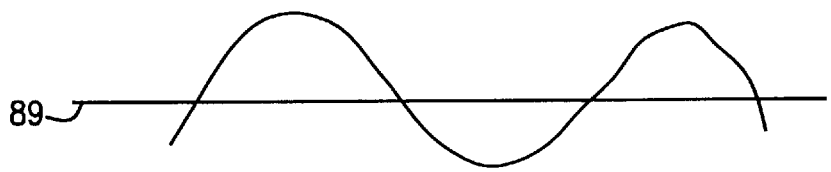

FIGS. 12a and 12b show graphically how such a volume 27 of coarse magnetic field uniformity is achieved notwithstanding the inherent variation in magnetic field of different segments 70 to 87. The magnetic field of different segments 70 to 87 is measured and adjacent segments are selected from the batch having slightly different field strengths so as to follow a substantially cyclic curve 90. Thus, as shown in FIGS. 11 and 12a, the particular segments 70 and 80 have a minimum magnetic field as compared to segment 85 which has a maximum magnetic field. The segments from 70 to 75 have increasing magnetic fields following the cyclic curve 90 in contrast to segments from 75 to 80 which have decreasing magnetic fields following the cyclic curve 90. Each of the pair of permanent magnet assemblies 40 and 42 is constructed according to this approach and are then opposed to one another in anti-phase such that the relationship of the corresponding magnetic fields of the pair of permanent magnet assemblies 40 and 42 corresponds to the two anti-phase cyclic curves shown in FIGS. 12a and 12b. The variations in magnetic field from its average value as described by lines 88 and 89 along the two cyclic curves then exactly cancel each other out, such that a region 54 between the pair of permanent magnet assemblies 40 and 42 has a volume 27 of uniform magnetic field.

It will be appreciated that various modifications to the above-described embodiment will be apparent to those of ordinary skill in the art in light thereof. The above embodiments are provided by way of illustration and not by way of limitation.

What is claimed is:

1. A permanent magnet assembly for use in an MRI device to produce a predetermined volume of substantially uniform magnetic field extending in a first direction beyond an upper surface of said permanent magnet assembly, said permanent magnet assembly comprising:

a first annular permanent magnet having an upper and a lower surface thereof, said upper surface of said first annular permanent magnet being of a first magnetic polarity and said lower surface of said first annular permanent magnet being of a second magnetic polarity, said first annular permanent magnet having an inside diameter, said first permanent magnet having at least a portion of said upper surface of said first annular magnet lying in a first plane and providing a first magnetic field in said predetermined volume, said first magnetic field having a zero rate of change in said first direction at a first point;

at least a second annular permanent magnet having an upper and a lower surface thereof, said upper surface of said second annular permanent magnet being of said first magnetic polarity and said lower surface of said second annular permanent magnet being of said second magnetic polarity, said second annular permanent magnet having an outside diameter which is smaller than said inside diameter of said first annular permanent magnet, said second annular permanent magnet providing a second magnetic field; and low permeability material interconnecting said first annular permanent magnet with said second annular permanent magnet, so that at least a portion of said upper surface of said second annular permanent magnet is in a second plane spaced from said first plane, whereby said second magnetic field is superimposed upon said first magnetic field, in said predetermined volume, having a zero rate of change in said first direction at a second point different from said first point, wherein said second annular permanent magnet defines an open passage passing therethrough.

2. The permanent magnet assembly according to claim 1, wherein said upper surface of each of said first and second annular permanent magnets comprises a plurality of steps.

3. The permanent magnet assembly according to claim 2, wherein each of said steps is parallel to said first plane.

4. The permanent magnet assembly according to claim 1, wherein said first and second annular permanent magnets comprise a plurality of permanently magnetized segments attached to adjacent segments using a non-conductive adhesive, so as to reduce eddy currents.

5. The permanent magnet assembly according to claim 1, wherein said upper surface of each of said first and second annular permanent magnets is inclined with respect to said first plane.

6. The permanent magnet assembly according to claim 1, wherein said first and second annular permanent magnets are movably mounted in relation to said low permeability material, whereby said permanent magnet assembly further comprises adjustment screws for setting along their common symmetry axis the locations of said first and second annular permanent magnets with respect to said low permeability material, thereby adjusting the height of the said first and respectively second planes along their axis of symmetry and thereby improving the uniformity of said magnetic field.

7. The permanent magnet assembly according to claim 1, further comprising an individual temperature control for each of said first and second annular permanent magnets, thereby improving the uniformity of said magnetic field.

8. The permanent magnet assembly according to claim 1, wherein shaped mumetal shims, fragments of soft iron and fragments of magnetic material of various polarities are disposed on said first or second surfaces of said first or second annular permanent magnets, thereby improving the uniformity of said magnetic field.

9. The permanent magnet assembly according to claim 1, wherein said low permeability material interconnecting said first annular permanent magnet and said second annular permanent magnet is a low electrical conductivity material.

10. The permanent magnet assembly according to claim 1, wherein said low permeability material interconnecting said first annular permanent magnet and said second annular permanent magnet is metallic and is slotted in order to reduce eddy currents.

11. The permanent magnet assembly according to claim 1, further comprising a low permeability support annular band surrounding said first annular permanent magnet.

12. The permanent magnet assembly according to claim 1, wherein said open passage is a bore, for allowing an instrument inserted into said bore to protrude from said upper surface of said permanent magnet assembly.

13. The permanent magnet assembly according to claim 12, wherein said bore is provided with a recess in said lower surface of said permanent magnet assembly for partially accommodating said instrument.

14. The permanent magnet assembly according to claim 12, wherein said instrument is a medical instrument and wherein said bore allows insertion of said medical instrument therethrough for positioning at least part of said medical instrument within said volume of substantially uniform magnetic field or within a body part or organ positioned within said volume.

15. A magnetic structure for use in an MRI device to produce a predetermined volume of substantially uniform magnetic field in a region, said magnetic structure comprising:

a first permanent magnet assembly having a first and a second surface thereof;

a second permanent magnet assembly having a first and a second surface thereof;

a mounting of low permeability material for mounting said first permanent magnet assembly at a first location with said first surface thereof facing one side of said region, and said second permanent magnet assembly at a second location with said first surface thereof facing said first surface of said first permanent magnet assembly on an opposite side of said region, so that said region is between said first surfaces of said first and second permanent magnet assemblies;

said first permanent magnet assembly having a first annular permanent magnet with a first and a second surface thereof, said first surface of said first annular permanent magnet being of a first magnetic polarity and said second surface of said first annular permanent magnet being of a second magnetic polarity, said first annular permanent magnet having an inside diameter, said first annular permanent magnet having at least a portion of said first surface of said first annular magnet lying in a first plane to provide a first magnetic field in said region, said first magnetic field having a zero rate of change in a first direction at a first point in said region;

said first magnet assembly also having at least a second annular magnet with a first and a second surface thereof, said first surface of said second annular magnet being of said first magnetic polarity and said second surface of said second annular permanent magnet being of said second magnetic polarity, said second annular permanent magnet having an outside diameter which is smaller than said inside diameter of said first annular permanent magnet, with at least a portion of said first surface of said second annular magnet lying in a second plane spaced from said first plane to provide a second magnetic field whereby said second magnetic field is superimposed upon said first magnetic field in said region, having a zero rate of change in said first direction at a second point different from said first point;

said second permanent magnet assembly having a third annular permanent magnet with a first and a second surface thereof, said first surface of said third annular permanent magnet being, of said second magnetic polarity and said second surface of said third annular permanent magnet being of said first magnetic polarity said third annular permanent magnet having an inside diameter, said third annular permanent magnet having at least a portion of said first surface of said third annular magnet lying in a third plane to provide a third magnetic field, whereby said third magnetic field is superimposed on said first and second magnetic fields in said region, having a zero rate of change in said first direction at a third point different from said first and second points; and said second magnet assembly also having at least a fourth annular permanent magnet having a first and a second surface thereof, said first surface of said fourth annular magnet being of said second magnetic polarity and said second surface of said fourth annular permanent magnet being of said first magnetic polarity, said fourth annular permanent magnet having an outside diameter which is smaller than said inside diameter of said third annular permanent magnet, with at least a portion of said first surface of said fourth annular permanent magnet lying in a fourth plane spaced from said third plane to provide a fourth magnetic field, whereby said fourth magnetic field is superimposed upon said first, second and third magnetic fields, in said region, having a zero rate of change in said first direction at a fourth point different from said first second and third points.

16. The magnetic structure according to claim 15, wherein said first and second permanent magnet assemblies further comprise an outer casing, capable of attachment to said mounting low permeability material, for mounting said first permanent magnet assembly and said second permanent magnet assembly in opposing relationships by a plurality of movable bolts.

17. The magnetic structure according to claim 15, wherein said mounting low permeability material for mounting said first permanent magnet assembly and said second permanent magnet assembly in opposing relationship allows lateral access around a patient's body part located between said first and second permanent magnet assemblies.

18. The magnetic structure according to claim 15, wherein said mounting low permeability material for mounting said first permanent magnet assembly and said second permanent magnet assembly in opposing relationships comprises a frame having low magnetic permeability and a set of jaws connected to said frame by a movable screw, wherein said movable screw connected to said frame is controlled by a MRI compatible motor attached to said screw, whereby said first and second permanent magnet assemblies are displaced in an axial direction to bring the first and second permanent magnet assemblies either closer together or farther apart, thereby improving the uniformity of said magnetic field.

19. The magnetic structure according to claim 15, wherein said mounting low permeability material for mounting said first permanent magnet assembly and said second permanent magnet assembly in opposing relationships comprises a frame having low magnetic permeability and a set of jaws connected to said frame by a movable screw, whereby each of the set of jaws may be rotated away from an opposing jaw around an axis passing along said movable screw, to allow access to a patient's body part located between said first and second permanent magnet assemblies.

20. The magnetic structure according to claim 15, wherein said magnetic structure further comprises an outer casing capable of attachment to said mounting low permeability material for mounting said first and second permanent magnet assemblies in opposing relationships by a plurality of adjustment screws, whereby said screws are attached to and move a respective annular permanent magnet, thereby improving the uniformity of said magnetic field.

21. The magnetic structure according to claim 15, wherein said magnetic structure further comprises shaped mumetal shims, fragments of soft iron and fragments of magnetic material of various polarities, disposed on said first or second surface of one or more of said annular permanent magnets, thereby improving the uniformity of said magnetic field.

22. The magnetic structure according to claim 15, wherein said magnetic structure further comprises an individual temperature control for each of said annular permanent magnets, thereby improving the uniformity of said magnetic field.

23. The magnetic structure according to claim 15, wherein said frame is movable by a MRI compatible motor control in a vertical and a series of horizontal directions, so that a composite image may be formed.

24. The magnetic structure according to claim 15, wherein all annular permanent magnets in said first and second permanent magnet assemblies comprise a plurality of permanently magnetized segments, each attached to its respective neighboring segments by means of a non-conductive adhesive, so as to reduce eddy currents.

25. The magnetic structure according to claim 15, wherein said first and second permanent magnet assemblies have an equal number of annular permanent magnets.

26. The magnetic structure according to claim 15, wherein said first and second permanent magnet assemblies have an unequal number of annular permanent magnets.

* * * * *

UNITED STATES PATENT AND TRADEMARK OFFICE
CERTIFICATE OF CORRECTION

PATENT NO. : 5,900,793
DATED : May 4, 1999
INVENTOR(S) : Ehud Katznelson, Yuval Zuk, Michael Sasson, Zeev Tamir It is certified that error appears in the above-indentified patent and that said Letters Patent is hereby corrected as shown below:

On the title page add the following:

[73] Asignee: Odin Technologies, Ltd.,
Yokneam Elit, Israel

Signed and Sealed this

Ninth Day of November, 1999

*Attest:*

Q. TODD DICKINSON

*Attesting Officer*     *Acting Commissioner of Patents and Trademarks*